US006613660B2

United States Patent
Kahlert et al.

(10) Patent No.: US 6,613,660 B2
(45) Date of Patent: Sep. 2, 2003

(54) METALLIZATION PROCESS SEQUENCE FOR A BARRIER METAL LAYER

(75) Inventors: Volker Kahlert, Dresden (DE); Frank Koschinsky, Radebeul (DE); Peter Hübler, Coswig (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/131,699

(22) Filed: Apr. 24, 2002

(65) Prior Publication Data

US 2003/0054625 A1 Mar. 20, 2003

(30) Foreign Application Priority Data

Sep. 20, 2001 (DE) .......................... 101 46 359

(51) Int. Cl.[7] .................. H01L 21/44; H01L 21/4763

(52) U.S. Cl. .............. 438/597; 438/687; 438/627; 438/643; 438/653; 438/677; 438/680

(58) Field of Search .................. 438/597, 687

(56) References Cited

U.S. PATENT DOCUMENTS 6,365,518 B1 * 4/2002 Lee et al.

* cited by examiner

Primary Examiner—John F. Niebling
Assistant Examiner—Stanetta Isaac
(74) Attorney, Agent, or Firm—Williams, Morgan & Amerson, P. C.

(57) ABSTRACT

In an in situ damascene metallization process employing a barrier layer between the metal and the dielectric, the generation of voids, especially at the bottom of vias, can be significantly reduced or even completely avoided by maintaining the surface temperature below a critical temperature during deposition of the barrier material.

28 Claims, 1 Drawing Sheet

METALLIZATION PROCESS SEQUENCE FOR A BARRIER METAL LAYER

BACKGROUND OF THE INVENTION

1. Field of the Invention

The present invention relates to the field of fabrication of integrated circuits, and, more particularly, to the fabrication of conductive interconnect lines by means of an in situ damascene process.

2. Description of the Related Art

The need for high performance semiconductor chips has continued to increase over the past several years, while at the same time the functionality of the circuitry has become more complex and the amount of area per chip has decreased. One approach to increase the speed and performance of the semiconductor chip is to reduce the size of the individual integrated circuit components. In modem integrated circuits, the channel length, and thus the gate length, of a typical field effect transistor (FET) is scaled down to a size of 0.2 $\mu$m and less to reduce the switching speed of the FET elements sufficiently in order to allow, for example, a central processing unit (CPU) to operate with clock frequencies of up to 1 GHz and above. With small feature sizes, the performance of the semiconductor chips is not only limited by the switching speed of individual FET elements, but also by the electrical conductivity of the metal interconnects electrically connecting the various individual components and by the parasitic capacitances associated with the metal interconnects. In order to take full advantage of transistor elements capable of operating at fast speeds and exhibiting smaller feature sizes, the metal interconnects must be highly conductive and/or the parasitic capacitance between adjacent interconnect lines or vias should be kept as low as possible.

A typical process for surface wiring the individual components of an integrated circuit, also referred to as "metallization," is the so-called damascene process in which trenches and/or vias are formed in an insulating layer and are subsequently filled with a conductive material to form the conductive lines interconnecting the individual components of the integrated circuit. Currently, most of the silicon-based semiconductor chips comprise a metallization layer including silicon dioxide as a dielectric material and aluminum as the conductive material due to aluminum's excellent adhesion to the surrounding silicon dioxide without any tendency to diffuse into the silicon dioxide. For integrated circuits having critical feature sizes of 0.5 $\mu$m and less, the so-called interconnect delay caused by the limited conductivity of the metal lines and the relatively high dielectric constant of the silicon dioxide begins to dominate the switching speed of individual semiconductor elements. Thus, great efforts have been made to replace the metal and/or the dielectric by an appropriate material so as to reduce the RC constant defined by the resistivity of the conductive lines and the parasitic capacitance between adjacent lines.

Recently, copper has been proven to be a promising candidate for replacing the aluminum due to its lower specific resistivity, which is about half of aluminum. Moreover, contrary to aluminum, copper does not show eutectic reactions and thermally induced electromigration when used in very large scale integration ("VLSI") and ultra-large scale integration ("ULSI") semiconductor chips. Additionally, copper is capable of being deposited at low temperatures with high aspect ratios, thereby yielding a good step coverage. The use of electrochemical deposition techniques for copper deposition is especially appealing due to low cost, high throughput, high quality of the deposited copper film, and excellent via/trench filling capabilities.

Furthermore, efforts have been made to replace silicon dioxide, which exhibits a dielectric constant of 3.8 and more depending on the deposition process, by appropriate materials having a significantly lower dielectric constant. As previously explained, in order to provide a highly reliable integrated circuit, the metal of the interconnect lines has to sufficiently adhere to the surrounding dielectric material, and diffusion of the metal atoms into the dielectric material must be reduced as much as possible. Thus, in many cases the metal may not be directly deposited onto the dielectric material. Instead, a barrier layer has to be deposited on the surface of the dielectric layer prior to deposition of the metal. For example, copper readily diffuses into silicon dioxide and does not adhere to silicon dioxide very well. Accordingly, a thin barrier layer, for instance comprising tantalum, is deposited to provide for sufficient adhesion of the copper and to prevent diffusion of the copper into the silicon dioxide.

A particularly serious issue in a damascene process is the generation of voids at the interface of the dielectric and the conductive material, especially at the bottom of vias formed in the conductive material that provide electrical contact to a previously formed metallization layer. In the damascene process using silicon dioxide and copper, a barrier layer is first deposited and, in order to avoid surface oxidation, a subsequent copper seed layer is formed in an in situ process, i.e., the same tool is used without breaking the vacuum between the deposition of the barrier layer and the copper seed layer. The synthesis of the barrier layer and the copper seed layer, however, results in stress-related damage, mainly in the form of voids. In particular, the voids generated at the bottom of a via that may establish contact to an underlying metal island or metal line are a significant reliability risk due to the degraded capability of conducting current to underlying components.

Although the crystal damage may be healed to some degree by an annealing process after deposition of the copper seed layer, the annealing step is a time-consuming process, and it has been observed that voids under or in vias cannot sufficiently be eliminated even by a long-lasting annealing process.

In view of the above, it is an object of the present invention to provide an effective method to significantly reduce void generation during a damascene metallization process.

SUMMARY OF THE INVENTION

According to one aspect of the present invention, an in situ method of forming a barrier metal layer on a substrate including a layer of dielectric material is provided, wherein the method comprises cleaning the surface of the substrate and depositing, in a plasma ambient, the barrier material on the surface of the substrate to form the barrier metal layer. Additionally, the method comprises controlling a temperature of the surface below a predefined critical temperature so as to inhibit void generation in the barrier metal layer.

According to another aspect of the present invention, an in situ method of forming a barrier metal layer on a substrate including a layer of dielectric material is provided, wherein the method comprises cleaning the surface of the substrate and depositing, in a plasma ambience, a barrier material on the surface of the substrate to form the barrier metal layer. Additionally, the method comprises performing at least one sequence interrupt, each of which defines a time period of reduced deposition activity on the surface, wherein the at least one sequence interrupt substantially avoids the generation of voids underneath the barrier metal layer.

According to a further aspect of the present invention, an in situ method of forming a barrier metal layer above a surface of a substrate comprises cleaning the surface of the substrate and depositing, in a plasma ambient, a barrier metal layer on the surface of the substrate. The method further comprises providing thermal contact from a source of coolant to a substrate and controlling a cooling power transferred from the source of coolant to the substrate to inhibit formation of voids in the barrier metal layer.

It should be noted that the term "barrier metal" used herein is intended to include metallic barrier materials, such as titanium and tantalum, as well as non-metals, such as tantalum nitride and titanium nitride, in conformity with the standard semiconductor terminology.

BRIEF DESCRIPTION OF THE DRAWINGS

The invention may be understood by reference to the following description taken in conjunction with the accompanying drawings, in which like reference numerals identify like elements, and in which.

Figure 1:
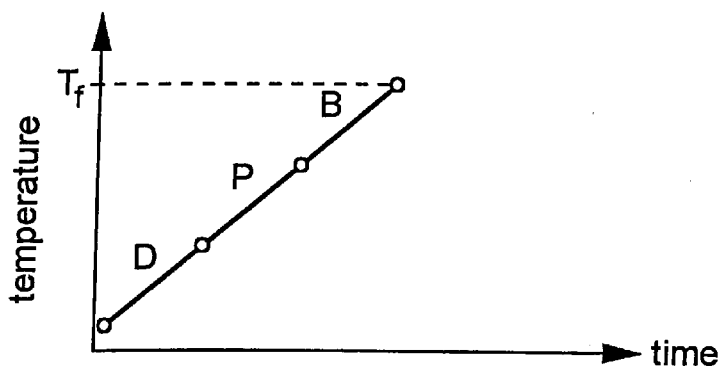
FIG. 1 is an illustrative graph depicting a typical process sequence of an in situ barrier metal deposition to explain the problems involved.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

As previously explained, a typical process flow for forming a copper metallization layer by a damascene process may comprise the following steps. First, a semiconductor substrate is introduced in a process chamber, such as a silicon wafer bearing a plurality of individual chip areas or die, each of which contains a huge number of individual semiconductor elements that provide for the required functionality of the integrated circuit. As is well known in the art, the process chamber may comprise an appropriate substrate stage to receive and hold the wafer during the various process steps. The substrate stage is in thermal contact with the wafer and allows heat exchange with the wafer. The process chamber is further adapted to hold a vacuum within the chamber and to allow a plasma ambient to be established, as is used, for example, in ionized metal plasma (IMP) sputtering.

Prior to depositing a barrier material on the surface of the wafer, for example, on a patterned layer of insulating material formed on the wafer that may include vias contacting an underlying metal, a cleaning step is necessary to remove any contaminates from the surface. The cleaning process may be started with a so-called degassing step in vacuum which is established in the process chamber, wherein the temperature of the wafer is raised, for example, by conducting heat to the wafer via the support stage or by radiation and the like, to promote the outgassing of contaminants. Thereafter, reactive gases including, for example, Ar and/or $H_2$, are introduced in the process chamber and a high-frequency electric field is applied to the reactive gases to establish a plasma for further removing contaminants from the insulating layer. Immediately after the completion of the cleaning process, sputter deposition of a barrier material is started, for instance by providing an ionized metal plasma, to form a barrier layer, for instance a tantalum layer, having a required thickness. In a typical process, a bias power of about 100–400 Watts is supplied for about 15–40 seconds to yield a thickness of the barrier layer of about 200–400 angstrom.

FIG. 1 schematically illustrates the above-explained process sequence depicting the surface temperature of the wafer versus the time of the process. In FIG. 1, the degassing step is indicated by D, the cleaning step (also referred to as pre-cleaning) is indicated by P, and the deposition step is indicated by B. Investigations have confirmed that the progression of the surface temperature of the wafer steadily increases with time and can be substantially represented by the curve shown in FIG. 1. The slope and the exact shape of the progression of the temperature versus time curve is determined by the wafer's capability to dissipate heat to the environment by, for example, heat conductivity to the support stage, radiation loss and convection. After completion of the deposition of the barrier material, e.g., tantalum and/or tantalum nitride, the surface of the wafer has reached a final temperature that is indicated as $T_f$ in FIG. 1. The magnitude of $T_f$ depends on deposition parameters such as magnitude of the applied bias power and duration of the deposition process as well as on the wafer's capability of dissipating heat. In general, the deposition of a thicker barrier layer requires a higher bias power and/or a longer time interval for depositing the barrier material so that $T_f$ is higher for thicker barrier layers.

In general, the thermal coefficients of different surface portions of the semiconductor structure on which the barrier material is to be deposited differ from each other. Provided that no unusual behavior such as phase changes (lattice transitions) occur, the different surface portions will continuously expand with increasing temperature, each according to its own coefficient of thermal expansion. As a consequence, the differences in the amount of dimensional expansion of the different materials, i.e., for example, the material at the bottom of a via formed in a layer of silicon dioxide ($SiO_2$) and the barrier material, will increase with increasing temperature. The resulting stress at the interface may destroy, at least locally, the adhesion between the barrier layer and the underlying material. It is believed that this mechanism mainly causes the formation of interface voids.

According to the inventor's finding, void generation at the interface at the bottom of a via can effectively be reduced, if not even completely avoided, by delaying the overall rise in the surface temperature until the deposition of the barrier material is completed. Seen from another point of view, the inventors discovered that there is a critical temperature $T_c$, depending on the deposition process and the materials involved, below which stress between the semiconductor surface and the barrier layer is tolerable, meaning that at temperatures below this critical temperature $T_c$, any stress occurring at the interface is not sufficient to locally destroy the adhesion of the barrier layer to the underlying wafer surface. The value of $T_c$ may be predefined for a particular application of materials in a particular integrated circuit device. If the temperature of the wafer during deposition is below the freezing point, substantially no voiding is found between Ta and Cu, but, for example, if it's higher than approximately 200° C., void formation is seen.

Figure 2:
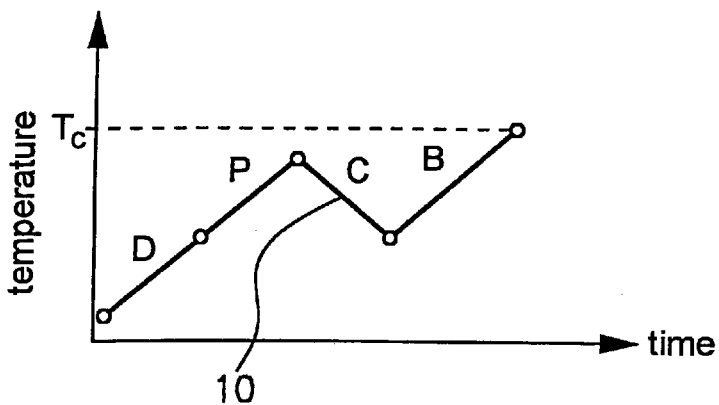
FIG. 2 illustrates an in situ process sequence according to one embodiment of the present invention.

FIG. 2 schematically shows the progression of temperature versus the process time for an in situ barrier layer deposition of a damascene process in accordance with one embodiment of the present invention. First, as previously described, a cleaning step including a degassing process is performed, indicated by D and P, and thereafter a sequence interrupt of a predefined time period is carried out in which substantially no cleaning activity is performed on the surface to allow the wafer surface to reduce the temperature by heat conductivity, radiation loss, and convection. This sequence interrupt is indicated by the portion of the line indicated with the numeral 10, and the reference letter "C." The time period may last from about 10 seconds to about 300 seconds, depending on the time required for the subsequent deposition of the barrier material to result in a desired barrier layer thickness. After the time period for the sequence interrupt has lapsed, the deposition process is resumed by depositing the barrier material, wherein the start temperature for the deposition process is significantly lower than it would be without the sequence interrupt. Accordingly, after completion of the deposition process, the final surface temperature does not exceed the critical temperature $T_c$, so that substantially no voids are generated at the interface of the barrier layer and the underlying surface even if immediately after depositing the barrier layer, a copper seed layer is deposited that may be required for the further deposition of bulk metal in the lines and vias.

Figure 3:
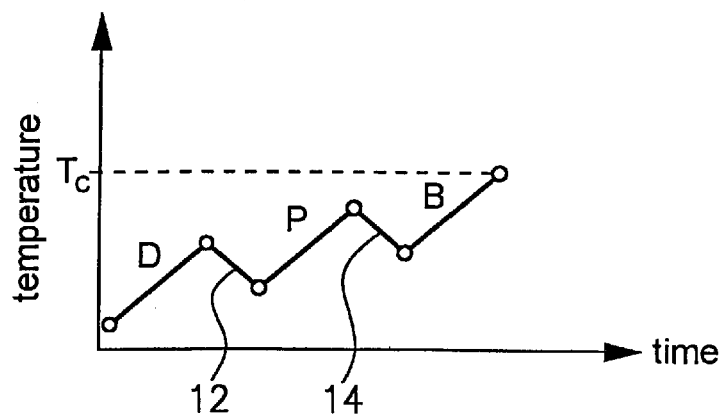
FIG. 3 illustrates an in situ process sequence according to a further embodiment of the present invention.

In FIG. 3, a further embodiment of the present invention is shown in which two sequence interrupts 12, 14 are performed to maintain a final surface temperature which is below the critical temperature $T_c$. In FIG. 3, a first sequence interrupt 12 is performed after completion of the degassing step, and a second sequence interrupt 14 is performed after completion of the pre-cleaning step.

For the embodiments depicted in FIGS. 2 and 3, typical process parameters are 60 seconds for the single sequence interrupt 10 in FIG. 2 and about 40 seconds for each of the sequence interrupts 12, 14 in FIG. 3, when a tantalum/tantalum nitride barrier layer of about 300 angstroms is deposited with bias power of about 300 Watts.

In one illustrative embodiment, one or more sequence interrupts are performed, for example similar to those shown in FIGS. 2 and 3, to maintain the surface temperature of the wafer well below the critical temperature $T_c$, since the critical temperature $T_c$ determined by experimentation may differ from the actual critical temperature $T_c$ due to experimental errors in measuring the surface temperature. Thus, once suitable process parameters such as length of the time period of the one or more sequence interrupts are obtained by experiment, it is no longer necessary to monitor the surface temperature of the wafer to maintain the surface temperature below the critical temperature $T_c$, since the process parameters, such as the additional cooling effect obtained by the one or more sequence interrupts, are selected so as to tolerate slight process variations occurring during the process in the process line. That is, the process may be controlled by adjusting the total time elapsed during the one or more sequence interrupts.

In general, the temperature gradient between the wafer (especially the surface thereof) and the environment of the chamber increases with increasing temperature of the wafer, so that a sequence interrupt immediately before the barrier metal deposition is most effective. For example, in one embodiment, one sequence interrupt of 10–70 seconds is sufficient to avoid void generation in a 300 Å Ta/TaN barrier layer deposited on and in silicon dioxide ($SiO_2$) with a bias power of about 300 Watts.

In a farther embodiment, the surface temperature of the wafer may be controlled by monitoring a temperature that is related to the surface temperature, such as the temperature of the bulk wafer or the temperature of the support stage that is in close contact with the wafer. In an actual deposition process formed in a process line, it may be difficult to determine the actual surface temperature during the process. Due to a temperature gradient from the surface of the wafer to the bulk material of the wafer, the temperature at the bottom of the wafer or at the surface of the support stage being in contact with the wafer may significantly differ from the surface temperature. Therefore, the temperatures at the bulk wafer and/or at the support stage and/or the cooling power supplied to the wafer, for example via the support stage, can be studied by experiment and may be correlated to the actual surface temperature, thereby taking into account such parameters as type of support stage, atmosphere prevailing in the process chamber during the deposition sequence, type of semiconductor wafer to be processed (including wafer type, wafer diameter, "history" of wafer processing including type of integrated circuit, number of already existing metallization levels, and the like). In this way, the actual surface temperature may be indirectly monitored by determining the temperature of the bulk wafer and/or the cooling power applied to the support stage to keep the final process temperature below the critical temperature $T_c$.

In an illustrative embodiment, the temperature of the bulk wafer is substantially kept constant at a value in the range of about 30–80° C. during the entire deposition sequence to insure that the surface temperature will not exceed the critical temperature $T_c$.

In a further embodiment, the cooling power supplied to the support stage is controlled to maintain a surface temperature below the critical temperature $T_c$. This can be accomplished, for example, by controlling the flow of a coolant to the support stage. Moreover, the controlling of the temperature and/or the cooling power may be combined with the performing of sequence interrupts as pointed out with reference to FIGS. 2 and 3. For instance, a sequence interrupt used for decreasing the surface temperature to an amount that is sufficient to stay well below the critical temperature $T_c$ after the completion of the entire deposition process may effectively be assisted by increasing the cooling power, whereby the risk of unduly increasing the temperature gradient between the surface and the bottom of the wafer is reduced, since heat generation at the surface of the wafer is low during the sequence interrupt.

Moreover, similar to the embodiment previously explained, a correlation between cooling power and void generation can be established by experiment, so that monitoring of surface temperature or of a temperature related thereto during the actual manufacturing process is not necessary. The cooling power may be maintained at a sufficiently high level during the entire process sequence, or may be increased only during sequence interrupts.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An in situ method of forming a barrier metal layer above a surface of a substrate including a layer of dielectric material, the method comprising:
    cleaning the surface of the substrate;
    depositing, in a plasma ambient, the barrier metal layer on the surface of the substrate; and
    controlling the temperature of the surface below a predefined critical temperature so as to inhibit void generation underneath the barrier metal layer.

2. The method of claim 1, wherein controlling the temperature of said surface includes cooling the surface prior to depositing the barrier metal layer.

3. The method of claim 1, wherein controlling the temperature of said surface includes cooling the surface prior to cleaning the surface.

4. The method of claim 2, wherein cooling the surface includes allowing the substrate to dissipate heat by at least one of thermal conduction, radiation and convection for a predefined time period.

5. The method of claim 4, wherein the predefined time period ranges from approximately 30 seconds to approximately 300 seconds.

6. The method of claim 1, further comprising, prior to cleaning the barrier metal layer, degassing the substrate to outgas contaminants.

7. The method of claim 1, wherein controlling the surface temperature of the surface includes controlling an average temperature of the substrate.

8. The method of claim 1, wherein controlling the temperature of the surface includes controlling the temperature of the substrate at one or more measurement points on the substrate.

9. The method of claim 8, wherein the one or more measurement points are provided at one of the surface and a bulk material of the substrate.

10. The method of claim 1, wherein the temperature of the surface is controlled by controlling a temperature of a substrate stage supporting and being in thermal contact with the substrate.

11. The method of claim 10, wherein the temperature of the substrate stage is adjustable within about 200K and about 500K.

12. The method of claim 11, further comprising performing one or more sequence interrupts without a cleaning and deposition activity, wherein a time period of each sequence interrupt is in the range of approximately 10 seconds to 100 seconds.

13. The method of claim 1, wherein the barrier metal layer comprises at least one of tantalum, tantalum nitride, titanium, titanium nitride, and a combination thereof.

14. The method of claim 1, further comprising forming a layer of copper above said barrier metal layer.

15. An in situ method of forming a barrier metal layer above a surface of a substrate, the method comprising:
    cleaning the surface of said substrate;
    depositing, in a plasma ambient, a barrier metal layer on the surface of the substrate; and
    performing at least one sequence interrupt, each of which defines a time period of reduced deposition activity on the surface of the substrate, said at least one sequence interrupt inhibiting the formation of voids in the barrier metal layer.

16. The method of claim 15, wherein cleaning the surface of said substrate comprises pre-degassing the surface of said substrate.

17. The method of claim 15, further comprising controlling a temperature of the substrate.

18. The method of claim 15, wherein said time period is selected based upon at least one of required thickness of the barrier metal layer and a bias power applied to the plasma ambient to maintain the plasma.

19. The method of claim 17, wherein controlling the temperature of the substrate includes monitoring the temperature and maintaining the monitored temperature below a predefined critical temperature.

20. The method of claim 19, wherein the monitored temperature is an averaged temperature.

21. The method of claim 19, wherein controlling the temperature of the substrate comprises monitoring a temperature of a substrate stage in thermal contact with and supporting the substrate.

22. The method of claim 19, wherein the predefined critical temperature is selected in correspondence to the monitored temperature.

23. The method of claim 15, further comprising forming a layer of copper above said barrier metal layer.

24. The method of claim 15, wherein said time period is in the range of 10–300 seconds.

25. The method of claim 15, wherein one sequence interrupt is performed prior to depositing the barrier metal layer.

26. The method of claim 15, wherein one sequence interrupt is performed prior to cleaning the surface of the substrate.

27. The method of claim 15, wherein said time period is selected based upon at least one of a required thickness of the barrier metal layer and a bias power applied to the plasma ambient to establish the plasma.

28. An in situ method of forming a barrier metal layer above a surface of a substrate, the method comprising:
    cleaning the surface of the substrate;
    depositing, in a plasma ambient, a barrier metal layer on the surface of the substrate;
    providing thermal contact from a source of coolant to the substrate; and
    controlling a cooling power transferred from the source of coolant to the substrate to inhibit formation of voids in the barrier metal layer.

* * * * *